United States Patent [19]

Hirakawa et al.

[11] Patent Number: 4,590,508
[45] Date of Patent: May 20, 1986

[54] MOS STATIC RAM WITH CAPACITIVELY LOADED GATES TO PREVENT ALPHA SOFT ERRORS

[75] Inventors: Noboru Hirakawa; Tohru Tsujide, both of Tokyo, Japan

[73] Assignee: Nippon Electric Co., Ltd., Tokyo, Japan

[21] Appl. No.: 555,420

[22] Filed: Nov. 29, 1983

Related U.S. Application Data

[63] Continuation of Ser. No. 229,432, Jan. 29, 1981, abandoned.

[30] Foreign Application Priority Data

Jan. 29, 1980 [JP] Japan .................................. 55-9069
Jan. 29, 1980 [JP] Japan .................................. 55-9070

[51] Int. Cl.⁴ ..................... H01L 27/04; H01L 29/78; G11C 11/40
[52] U.S. Cl. ..................... 357/41; 357/23.6; 357/29; 357/51; 357/59; 365/154
[58] Field of Search ..................... 357/23.6, 29, 41, 51, 357/59; 365/149, 150, 154

[56] References Cited

U.S. PATENT DOCUMENTS

| | | | |
|---|---|---|---|
| 3,657,614 | 4/1972 | Cricchi | 357/23 MG |
| 4,110,776 | 8/1978 | Rao et al. | 357/235 |
| 4,130,892 | 12/1978 | Gunckel et al. | 365/154 |
| 4,240,097 | 12/1980 | Raymond, Jr. | 357/23 S |
| 4,258,378 | 3/1981 | Wall | 357/50 |

OTHER PUBLICATIONS

Dingwall et al, 1978 IEEE Internat. Electron Dev. Meeting, Tech. Digest, pp. 193-197 (Dec. 3, 1978).
Koyanagi et al, 1978 IEEE IEDM Tech. Dig., pp. 348-351 (12-78).

Primary Examiner—William D. Larkins
Attorney, Agent, or Firm—Sughrue, Mion, Zinn, Macpeak and Seas

[57] ABSTRACT

A semiconductor device in which a logic information can be held stably without being influenced by α-rays, is disclosed. The major feature of the device resides in that a capacitor is provided at a control terminal of a transistor holding a logic information thereby to increase an effective capacitance of the control terminal.

14 Claims, 13 Drawing Figures

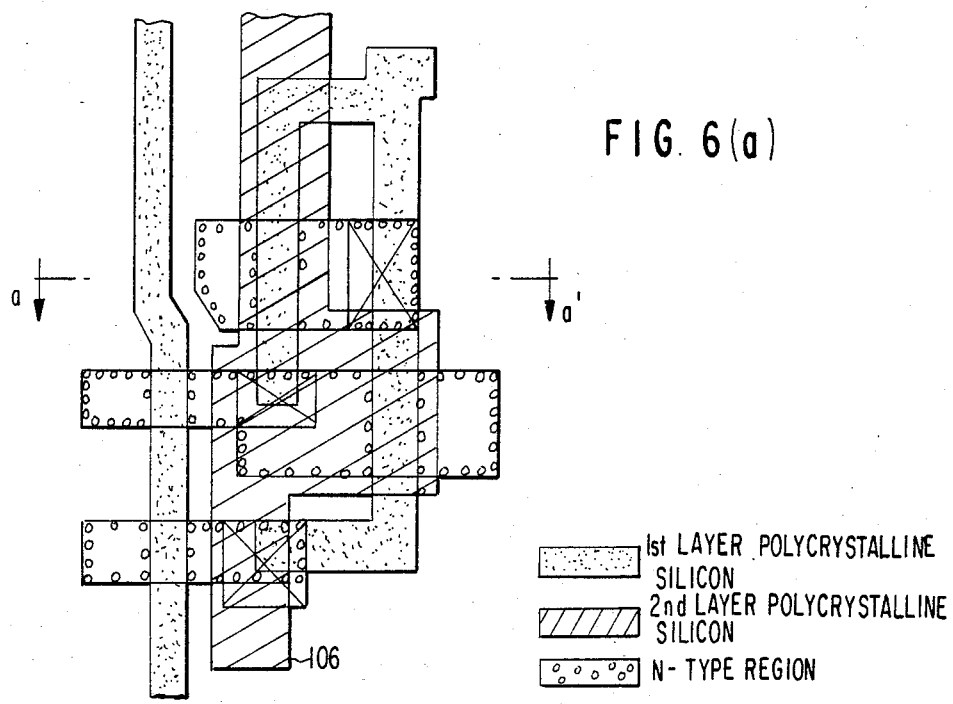
FIG. 6(a)
1st LAYER POLYCRYSTALLINE SILICON
2nd LAYER POLYCRYSTALLINE SILICON
N-TYPE REGION
FIG. 6(b)
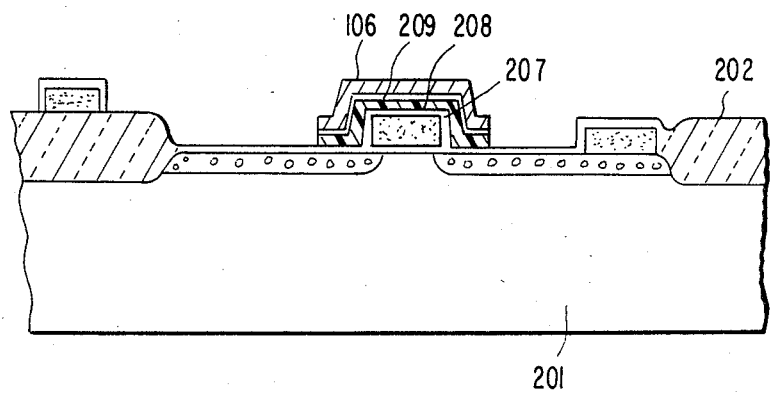
FIG. 7
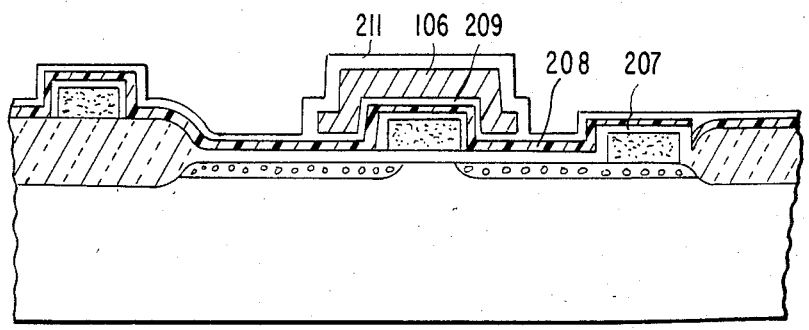

MOS STATIC RAM WITH CAPACITIVELY LOADED GATES TO PREVENT ALPHA SOFT ERRORS

This application is a continuation, of application Ser. No. 229,432, filed Jan. 29, 1981, now abandoned.

BACKGROUND OF THE INVENTION

The present invention relates to a semiconductor device formed on a semiconductor substrate, and more particularly to a semiconductor memory device composed of insulated gate field effect transistors.

In a semiconductor memory device, in accordance with the progress of the patterning technique and the reduction of the transistor size, an area of a memory cell is being more and more reduced year by year. Especially in a static type semiconductor memory device employing a flip-flop circuits as a memory cells, the proportion of the area of the memory cells to that of the entire chip is larger than in a dynamic type semiconductor device. Hence, contribution of the reduction of the area of the memory cell to the miniaturization of the pattern is larger in the former type. However, the reduction of the memory cell area would naturally bring about reduction of an electrostatic capacitance associated with the nodes for cross-connection of the transistors forming the flip-flop. Accordingly, an electric charge quantity to be stored at the node is reduced.

On the other hand, in order to achieve reduction of power consumption upon stand-by of the static type semiconductor memory device, a polycrystalline silicon resistor of several M ohm to several G ohm has been used as a load in the memory cell. If an electric charge quantity to be stored in the cross-connection nodes of a static type memory cell becomes small and a load resistance for supplementing the electric charge becomes large as described above, then the so-called "soft error" comes into question.

"Soft error" implies destruction of stored data in a memory caused by α-rays as reported by T. C. May in 1978 on the International Reliability Physics Symposium. In more particular, when the α-rays generated upon disintegration of natural radioactive elements such as uranium, and thorium which are present in a package material in the amount of PPM units, penetrate through the memory array region, electron-positive hole pairs are formed in the silicon substrate and these electrons would lower the positive potential held by the electric charge stored at the cross-connection points. Consequently, inversion of the memory cell information would arise.

Immediately after an information has been written in a static memory cell, either one of the cross-connection points of the flip-flop takes a potential that is lower than the address potential by a value of single threshold voltage of a gate transistor, and if the α-rays should strike against this cross-connection point before the point is raised up to a higher potential through the load, in the case where the stored electric charge quantity is small, the potential at the cross-connection point would become smaller than the gate threshold voltage of the flip-flop transistor, and sometimes inversion of the flip-flop circuit would arise. In other words, if the load resistance is high, in a certain period the static type memory cell can be considered similarly to the dynamic type memory cell.

As one measures for preventing the soft error caused by the α-rays, it will be conceived to select the static capacitance at the cross-connection nodes in the flip-flop as large that the flip-flop may not be inverted. However, enlargement of the capacitance at the cross-connection point would necessarily result in enlargement of the plane configuration of the memory cell, which is contrary to the recent tendency to reduce the size of the memory cell. Hence, obviously it would greatly hinder the high density integration of memory cells.

In addition, not only in the above-described static type memory cells, but also generally in a circuit making use of insulated gate field effect transistors, especially in a dynamic circuit which utilizes a temporary memory effect of a gate section in an insulated gate field effect transistor such as, for example, a dynamic shift register and a dynamic type frequency-divider circuit, there exists the problem that due to penetration of the α-rays through the gate section of the field effect transistor, disappearance of an electric charge stored at the gate section would occur and thereby a correct logic information would be lost.

SUMMARY OF THE INVENTION

It is therefore one object of the present invention to provide a semiconductor device which is made not to be influenced by the α-rays without increasing the area of the transistors and the like.

Another object of the present invention is to provide a semiconductor memory device having a large memory capacity which is operable with a low power consumption.

Still another object of the present invention is to provide a semiconductor device comprising an insulated gate field effect transistor having excellent gate memory holding characteristics.

Yet another object of the present invention is to provide a method for producing the above-mentioned transistor having excellent gate memory holding characteristics.

The major feature of the present invention resides in that a capacitor is provided at a control terminal of a transistor, especially, a gate of an insulated gate field effect transistor, which holds an logic information at its control terminal (gate) thereby to increase an effective capacitance of the control terminal (gate).

In the present invention, it is favorable to fabricate the control terminal (gate) of the transistor and the above-mentioned capacitor with stacked first and second conductive layers in which the first conductive layer functions as the control terminal (gate) receivable logic information and the second conductive layer is supplied with a predetermined voltage thereby to function as the capacitor for the control terminal (gate).

The present invention is applicable to all kinds of memory device such as shift register and random access memory in which logic information is held or retained at a control terminal of a transistor, such as a gate of an insulated gate field effect transistor.

In particular, to cross-coupled gate and drains of a flip-flop type memory cell and to a gate of an inverter transistor followed by a sampling gate in a dynamic shift register, it is favorable to apply the capacitor structure according to the present invention.

According to the present invention, the amount of electric charge stored at the control terminal is remarkably increased and hence the logic information represented by the state of the electric charge can be stably retained without being influenced by the α-rays and noises.

The semiconductor memory device according to the present invention is characterized in that use is made of a memory cell, which comprises a flip-flop circuit formed by cross-connecting output electrodes and control electrodes of a pair of transistors to each other, and a pair of capacitors having their one ends respectively connected to the respective cross-connection points in said flip-flop circuit and the other ends connected to a predetermined potential source.

The present invention is also applicable to both the semiconductor memory device employing field effect transistors and the semiconductor memory device employing bipolar transistors. More particularly, in the case where field effect transistors are used for the transistors for forming the flip-flop circuit, the flip-flop circuit could be constructed by employing the drain of the field effect transistors as the output electrode and employing the gate electrode of the field effect transistor as the control electrode. On the other hand, in the case where bipolar transistors are used to from said flip-flop circuit, the flip-flop circuit could be constructed by cross-connecting bases and collectors of a pair of bipolar transistors to each other.

According to one feature of the present invention, there is provided a semiconductor device comprising an insulated gate field effect transistor having a gate adapted to store an information therein and a conducting layer provided on the gate of said transistor via an insulating film, whereby the electrostatic capacitance of said gate can be increased.

According to another feature of the present invention, there is provided a semiconductor device in which an electrode fixedly held at a predetermined potential is formed above and at the side portions of a gate electrode of a transistor to form a capacitance between the gate electrode and first said electrode and thereby increase the electric charge quantity to be stored.

According to still another feature of the present invention, there is provided a method for producing a semiconductor device in which an electrode fixedly held at a predetermined potential is formed above and at the side portions of a gate electrode of a transistor to form a capacitance between the gate electrode and first said electrode and thereby increase the electric charge quantity to be stored.

According to still another feature of the present invention, there is provided a method for producing a semiconductor device comprising a conducting layer for forming a capacitance between a gate electrode of a field effect transistor and said conducting layer, which method includes the steps of forming said gate electrode of a first polysilicon layer, oxidizing the surface of said gate electrode, growing a silicon nitride film, oxidizing a part of said silicon nitride film, growing a second polysilicon layer, patterning said second polysilicon layer so as to cover at least said polysilicon gate electrode in the direction of a channel width, oxidizing the surface of said second polysilicon layer, and etching said silicon nitride film by employing said oxide film as a mask.

The present invention is greatly effective for forming gate electrode capacitances of flip-flop transistors in a dynamic type shift register or in a flip-flop type memory cell.

BRIEF DESCRIPTION OF THE DRAWINGS

The above-mentioned and other features and objects of the present invention will become more apparent by reference to the following description of preferred embodiments of the invention taken in conjunction with the accompanying drawings, wherein.

DETAILED DESCRIPTION OF THE PREFERRED EMBODIMENTS

Now one preferred embodiment of the present invention as applied to a static memory cell will be described in greater detail with reference to the accompanying drawings.

Figure 1:
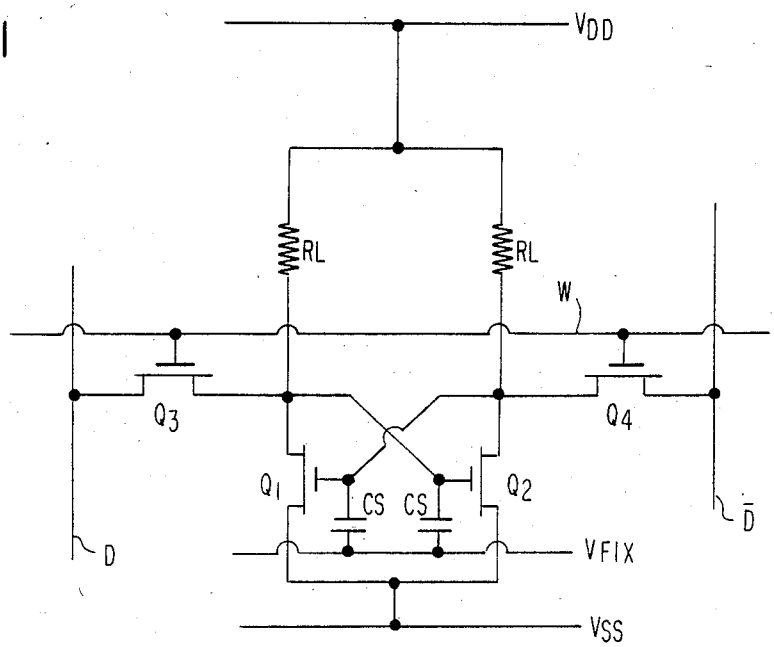
FIG. 1 is a circuit diagram showing a memory according to one preferred embodiment of the present invention.

As shown in FIG. 1, a memory cell in a memory device according to the present invention comprises flip-flop transistors $Q_1$ and $Q_2$ whose drains and gates are cross-connected, transfer gate transistors $Q_3$ and $Q_4$ which are respectively disposed between the drains of the transistors $Q_1$ and $Q_2$ and digit lines D and $\overline{D}$, respectively, and whose gates are connected to a word line W, load resistors $R_L$ having a high resistance, and capacitors $C_S$ connected to the respective gates of the flip-flop transistors $Q_1$ and $Q_2$ in the memory cell. The other ends of the capacitors $C_S$ are connected in common to a fixed potential source $V_{FIX}$. This memory cell is actuated by a high potential power supply $V_{DD}$ and a low potential power supply $V_{SS}$. In this circuit arrangement, the resistance of the load resistor $R_L$ is selected at such a high resistance that a current nearly of the magnitude adapted to compensate for the leakage through the gate-drain paths of the transistors $Q_1$ and $Q_2$ may be passed therethrough so as to maintain given gate levels of the transistors $Q_1$ and $Q_2$ via the transfer gate transistors $Q_3$ and $Q_4$, respectively. Here the capacitance $C_S$ have the function of stably holding the set state of the flip-flop against any external disturbances such as α-particles or the like by holding the gate potentials of the respective transistors $Q_1$ and $Q_2$ with the electric charge stored therein.

Figure 2A:
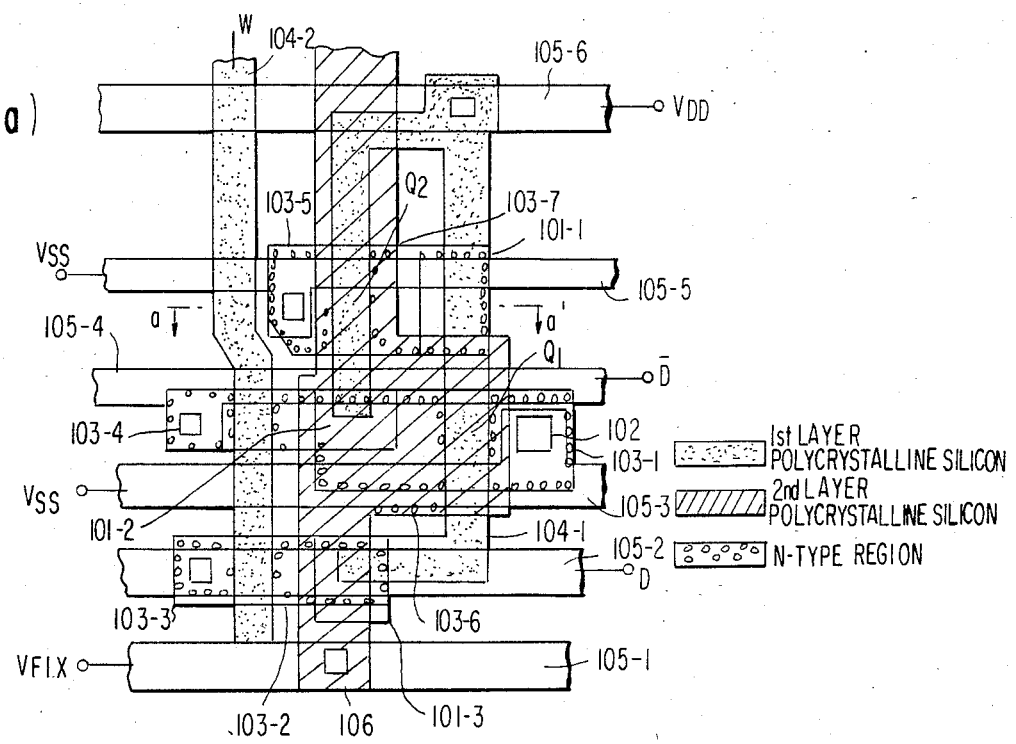
FIG. 2(a) is a plan view showing a semiconductor device practically embodying the memory shown in FIG. 1.
Figure 2B:
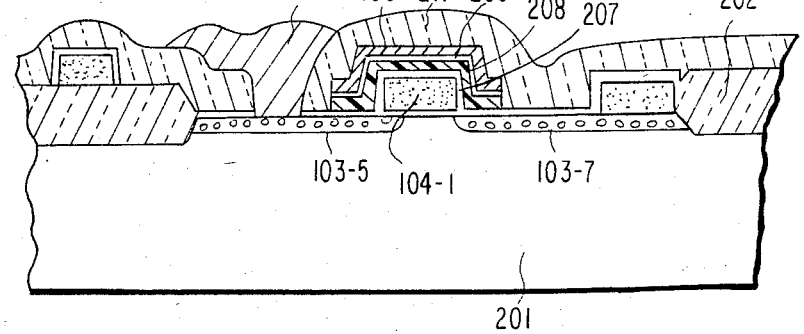
FIG. 2(b) is a cross-section view of the same semiconductor device taken along line a—a' in FIG. 2(a), and FIGS. 3 to 10 show the successive steps in the manufacturing process of the semiconductor device shown in FIG. 2, FIG. 3(b) being a cross-section view taken along line a—a' in FIG. 3(a), FIG. 6(b) being a cross-section view taken along line a—a' in FIG. 6(a), and FIGS. 4, 5 and 7 to 10 being cross-section views.

A semiconductor device practically embodying the memory cell shown in FIG. 1 is illustrated in FIG. 2. In the illustrated example, in a P-type semiconductor substrate 201 are formed N-type regions 103-1 to 103-7 to be used as source and drain regions of the respective transistors. On the other hand, the word line W and the silicon gates of the transistors $Q_3$ and $Q_4$ are formed by a polycrystalline silicon layer 104-2 of a first layer. The transistor $Q_3$ comprises N-type regions 103-3 and 103-2, while the transistor $Q_4$ comprises N-type regions 103-4 and 103-6. In addition, the two load resistors $R_L$ and the silicon gates of the transistors $Q_1$ and $Q_2$ are formed by a branched polycrystalline silicon layer 104-1 of the first layer. The transistor $Q_1$ comprises N-type regions 103-1 and 103-6 as its source and drain regions, while the transistor $Q_2$ comprises N-type regions 103-5 and 103-7 as its source and drain regions. The N-type regions 103-2, 103-6 and 103-7, respectively, make interconnection with the polycrystalline silicon layer 104-1 at the contact sections 101-3, 101-2 and 101-1, respectively. In this arrangement, a polycrystalline silicon layer 106 of a second layer is provided so as to cover the gate sections of the transistors $Q_1$ and $Q_2$, respectively, via an insulating film, to form capacitances between the polysilicon layer 106 and the silicon gates of the transistors $Q_1$ and $Q_2$. Six aluminum wirings 105-1 to 105-6 directed in the lateral direction are provided. The wiring 105-1 is connected to the polycrystalline silicon layer 106 to supply a fixed potential $V_{FIX}$ to the latter. The wirings 105-2 and 105-4, respectively, form digit lines D and $\overline{D}$ and connect to the N-type regions 103-3 and 103-4, respectively. The wirings 105-3 and 105-5 connect to the N-type regions 103-1 and 103-5, respectively, to supply a potential $V_{SS}$ to the latter. The wiring 105-6 connects to a polysilicon layer 104-1 to supply a potential $V_{DD}$ to the latter. In the above-described circuit arrangement, as the fixed potential $V_{FIX}$, the power supply potential $V_{DD}$ or $V_{SS}$ or still another fixed potential could be employed, but it is desirable to use a potential source whose potential level is as stable as possible.

Now the manufacturing process of the semiconductor device illustrated in FIG. 2 will be explained with reference to FIGS. 3 to 10. It is to be noted that the following description will be made with respect to the cross-section portion taken along line a—a' in FIG. 2 (a).

Figure 3A:
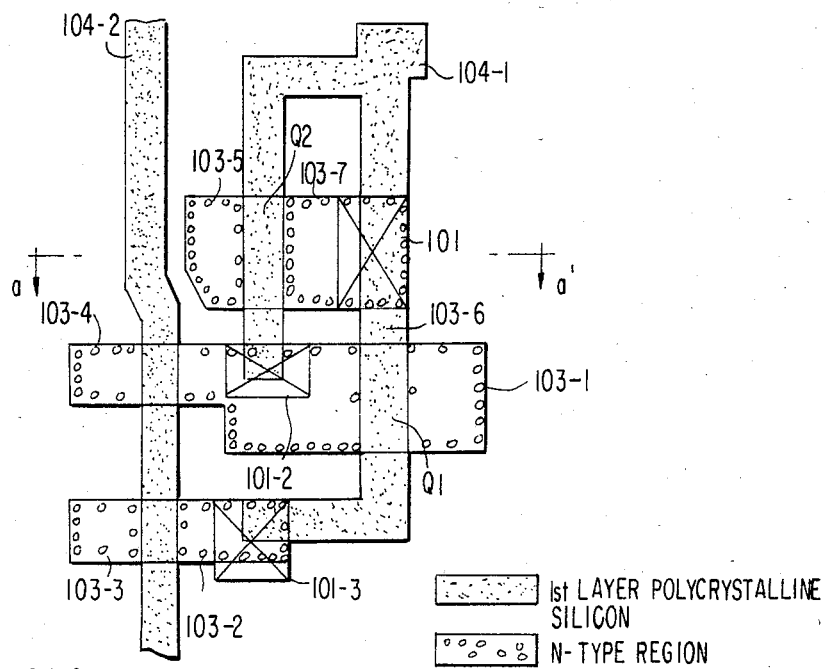
Figure 3B:
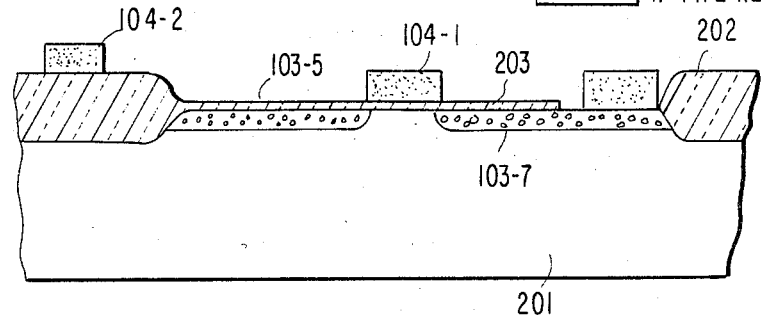

At first, as shown in FIG. 3, on a semiconductor substrate 201 are formed a field oxide film 202 and a gate oxide film 203 through a well-known process. Next a polycrystalline silicon layer for a wiring and a polycrystalline silicon layer 104-1 and 104-2 for a word line and gates of the transistors $Q_3$ and $Q_4$, are formed of a first polycrystalline silicon layer, and then N-type impurity is diffused to form source and drain regions 103-1 to 103-7.

Figure 4:
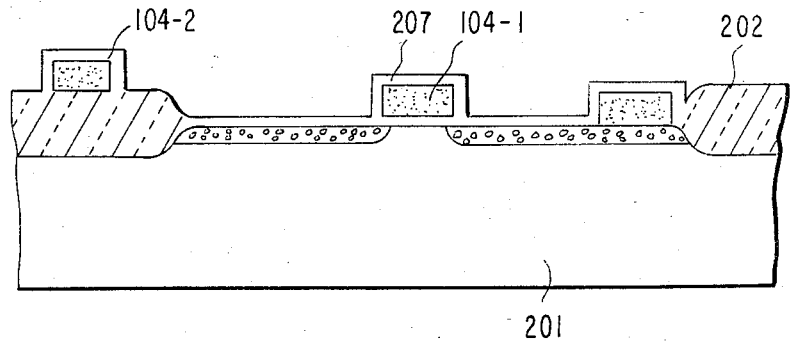

Next, as shown in FIG. 4, a silicon oxide film 207 of 100 Å to 500 Å in thickness is formed by thermal oxidation.

Figure 5:
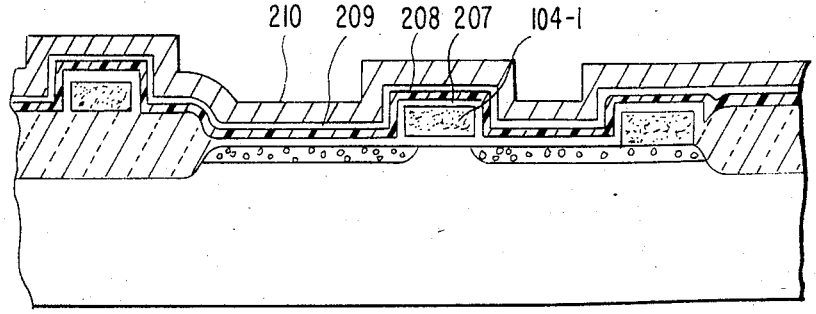

Then, as shown in FIG. 5, a silicon nitride film 208 is grown up to a thickness of 100 Å to 700 Å. Thereafter thermal oxidation is carried out to convert the surface portion of the silicon nitride film 208 to a silicon oxide film 209 up to a thickness of 30 Å to 50 Å. This silicon oxide film 209 formed by thermal oxidation serves to prevent lowering of a withstand voltage across a capacitor caused by pin holes in the silicon nitride film 208. The silicon oxide film 207, silicon nitride film 208 and silicon oxide film 209 jointly form a dielectric layer of three-layer structure for the capacitor. Next, a second polycrystalline silicon layer 210 is grown up to a thickness of 2000 Å to 6000 Å.

Subsequently, as shown in FIG. 6, patterning is effected upon the second polycrystalline silicon layer 210 through a photo-etching process to form a capacitor electrode 106. This patterned second polycrystalline silicon layer 106 is formed so as to cover the silicon gate electrodes of the field effect transistors of the flip-flop in the channel direction.

Next, as shown in FIG. 7, the patterned second polycrystalline silicon layer 106 is oxidized by thermal oxidation up to a thickness of 1000 Å to 2000 Å. During this thermal oxidation, the region where the second polycrystalline silicon layer has been removed by photo-etching is almost not oxidized, because that region is made of an oxidation-resistive silicon nitride film 208.

Figure 8:
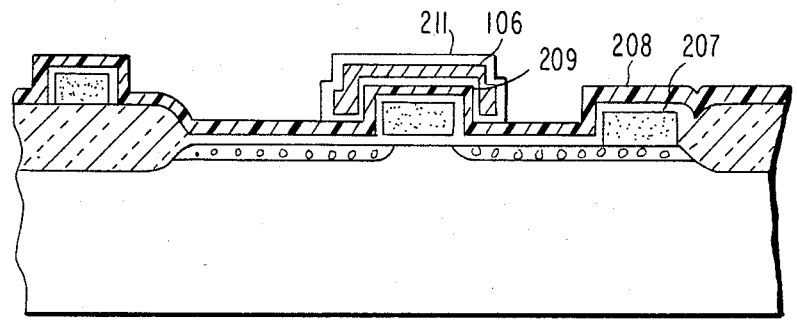

Thereafter, as shown in FIG. 8, the silicon oxide film is selectively etched by means of a hydrofluoric acid solution so that the silicon oxide film 211 on the second polycrystalline silicon layer may be retained but the silicon film on the silicon nitride film 208 may be entirely removed.

Figure 9:
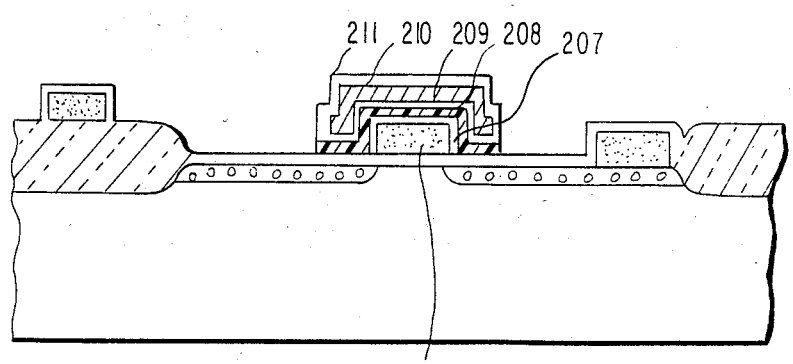

Then, as shown in FIG. 9, the silicon nitride film 208 is etched by means of plasma of lialides or by means of phosphoric acid, by making use of the silicon oxide film 211 as a mask. During this step of the process, the second polycrystalline silicon layer 106 is protected by the silicon oxide film 211 and thus it is not etched.

Figure 10:
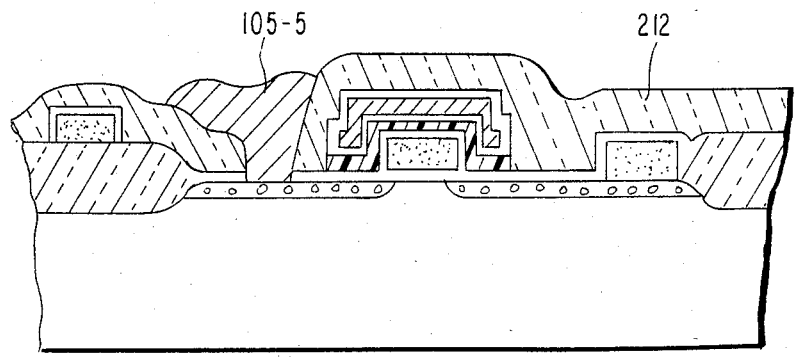

Subsequently, as shown in FIG. 10, a CVD oxide film 212 is grown as usual. Then, apertures for electrodes are opened, then vapor deposition of aluminum and patterning by photo-etching are effected, and an aluminum electrode 213 is formed. In this way, a semiconductor device as shown in FIG. 2 can be obtained.

As described above, according to the present invention, a semiconductor memory device including memory cells which are made not to be influenced by the $\alpha$-rays without increasing the area of the memory cells, can be obtained.

It is to be noted that besides memory cells, the present invention is widely applicable to manufacture of transistors having capacities added to their gates.

We claim:

1. A semiconductor device, comprising: a semiconductor substrate, a plurality of insulated gate field effect transistors formed on said semiconductor substrate, first and second ones of said transistors having cross-coupled control terminals and first terminals, and commonly connected second terminals, first and second resistors coupled between said first terminals of said first and second ones of said transistors and a power voltage terminal, respectively, a first layer of polycrystalline silicon wiring including first and second patterns formed on said semiconductor substrate, each of said first and second patterns including consecutive first and second portions, the first portions of said first and second patterns functioning as said control terminals of said first and second transistors, respectively, the second portions of said first and second patterns functioning as said second and first resistors, respectively, a second layer of polycrystalline silicon wiring disposed on both of said first portion of said first pattern and said first portion of said second pattern through respective insulator layers to provide said control terminals of said first and second transistors with first and second capacitances, respectively, each of said insulator layers including a silicon-nitride film underlying only said second layer of polycrystalline silicon wiring, and wiring means for supplying said second layer with a constant voltage, said first and second capacitances being separately formed between the control terminal of said first transistor and said second layer and between the control terminal of said second transistor and said second layer, respectively.

2. In a semiconductor memory device including a semiconductor substrate, a plurality of memory insulated gate field effect transistors formed on said substrate, and a plurality of transfer insulated gate field effect transistors, each of said transfer transistors operatively transferring a logic signal to a gate of an associated one of said memory transistors, and each of said memory transistors holding the transferred logic signal at its gate, the improvement comprising: a conductive layer covering gates of said memory transistors through an insulator layer to provide independent capacitances between said gates of said memory transistors and said conductive layer, said insulator layer including a silicon-nitride film having the same pattern as said conductive layer and underlying said conductive layer, and means for supplying said conductive layer with a constant voltage.

3. The device accordinbg to claim 2, in which said gates of said memory insulated gate field effect transistors are formed by a first polycrystalline silicon layer.

4. The device according to claim 3, in which said conductive layer is formed by a second polycrystalline silicon layer.

5. The device according to claim 3, in which gates of said transfer insulated gate field effect transistors one formed by said first polycrystalline silicon layer.

6. A semiconductor memory device, comprising: a semiconductor substrate; a first conductive layer; a plurality of word lines; a plurality of digit lines; a plurality of memory cells, each of said memory cells including a first and a second transistor having cross-coupled control terminals and first terminals, and commonly connected second terminals; first and second resistors coupled between said control terminals of said first and second transistors and a power voltage, respectively; said conrol terminals of said first and second transistors and said first and second resistors being formed of said first conductive layer including a silicon-nitride film underlying only said second conductive layer; first and second capacitors individually connected between the control terminals of said first and second transistors and a constant voltage, and formed by a second conductive layer disposed on said control terminals of said first and second transistors in each of said memory cells through an insulator layer; and wiring means for supplying said second conductive layer with said constant voltage.

7. The semiconductor memory device according to claim 6, in which said insulator layer is formed of a silicon-oxide film overlapped with and a silicon-nitride film.

8. A semiconductor device, comprising: a semiconductor substrate of a first condutive type; a first insulated gate field effect transistor having first and second semiconductor regions of a second opposite conductive type as its source and drain formed in said semiconductor substrate, and a first gate formed on a first channel region defined by said first and second semiconductor regions, a second insulated gate field effect transistor having third and fourth semiconductor regions of said second conductive type as its drain and source formed in said semiconductor substrate, and a second gate formed on a second channel region defined by said third and fourth semiconductor regions, first means for connecting said first semiconductor region with said second gate, second means for connecting said third semiconductor region with said first gate, a conductive layer disposed on said first and second gates through an insulator layer, said insulator layer including a silicon-nitride film underlying only said conductive layer, third means for supplying said first semiconductor region with logic information, and fourth means for supplying said conductive layer with a constant voltage to provide said first and second gates with capacitances.

9. The device as claimed in claim 8, in which said first and second gates and said conductive layer are formed by different layers of polycrystalline silicon.

10. A semiconductor device, comprising: a semiconductor substrate, an insulated gate field effect transistor formed on said semiconductor substrate, a first layer of polycrystalline silicon wiring formed on said semiconductor substrate, a first part of said layer of wiring functioning as a gate of said transistor, a second part of said layer of wiring functioning as a resistor, a second layer of polycrystalline silicon wiring, a part of said second layer of wiring being superimposed on said first part of said first layer of wiring in spaced-apart relation through an insulator layer, said insulator layer including a silicon-nitride film underlying only said second layer of polycrystalline silicon wiring, means for supplying said gate of said transistor with a logic signal, means for supplying said resistor with electrical power, and means for supplying said second layer of wiring with a constant voltage.

11. In a semiconductor memory device including a semiconductor substrate, a plurality of memory insulated gate field effect transistors formed on said substrate, a plurality of transfer insulated gate field effect transistors, each of said transfer transistors operatively transferring a logic signal to a gate of an associated one of said memory transistors, and a plurality of resistors, each of said memory transistors holding the transferred logic signal at its gate, the improvement comprising: a conductive layer covering gates of said memory transistors through an insulator layer, said insulator layer including a silicon-nitride film underlying only said conductive layer, means for supplying said conductive layer with a predetermined voltage, and means for supplying said memory transistors with a power supply voltage through said resistors.

12. The device according to claim 11, in which said gates of said memory transistors and said resistors are formed by a first polycrystalline silicon layer.

13. An integrated circuit comprising a semiconductor substrate; a plurality of memory cells, each of said memory cells including first and second transistors having crosscoupled control terminals and commonly connected second terminals, first and second resistors coupled between the first terminals of said first and second transistors and a power voltage terminal, respectively, and first and second capacitors coupled between the control terminals of said first and second transistors and a constant voltage terminal, respectively; a first layer of polycrystalline silicon formed on said semiconductor substrate, said first layer of polycrystalline silicon including a plurality of first to fourth portions, each of said first portions forming the control terminal of said first transistor, each of said second portions forming the control terminal of said second transistor, each of said third portions functioning as said first resistor, each of said fourth portions functioning as said second resistor; a second layer of polycrystalline silicon disposed on both of said first and second portions of said first layer of polycrystalline silicon with an insulator layer interposed therewith, the overlapped structure of each of said first portions and said second layer of polycrystalline silicon forming said first capacitor, the overlapped structure of each of said second portions and said second layer of polycrystalline silicon forming said second capacitor; and wiring means for connecting said second layer of polycrystalline silicon to a constant voltage.

14. The integrated circuit according to claim 13, in which said insulator layer includes a silicon-nitride film underlying only said second layer of polycrystalline silicon.

* * * * *

UNITED STATES PATENT AND TRADEMARK OFFICE
CERTIFICATE OF CORRECTION

PATENT NO. : 4,590,508
DATED : May 20, 1986
INVENTOR(S) : Noboru Hirakawa; Tohru Tsujide It is certified that error appears in the above-identified patent and that said Letters Patent is hereby corrected as shown below:

Column 2, line 1, "As one measures" should read

-- As one measure --;

Column 3, line 23, "used to from" should read

-- used to form --;

Column 4, line 49, "Here the capacitance" should read

-- Here the capacitors --;

Column 6, line 9, after "silicon" first occurrence, insert -- oxide --.

Signed and Sealed this

Twenty-first Day of October, 1986

[SEAL]

*Attest:*

DONALD J. QUIGG

*Attesting Officer*     *Commissioner of Patents and Trademarks*